United States Patent [19]
Lohninger

[11] Patent Number: 5,986,509
[45] Date of Patent: Nov. 16, 1999

[54] TRANSISTOR AMPLIFIER STAGE

[75] Inventor: Gerhard Lohninger, Munich, Germany

[73] Assignee: Siemens Aktiengesellschaft, Munich, Germany

[21] Appl. No.: 09/123,827

[22] Filed: Jul. 28, 1998

[30] Foreign Application Priority Data

Jul. 28, 1997 [DE] Germany ............... 197 32 437

[51] Int. Cl.$^6$ ............... H03F 1/30; H03F 3/04
[52] U.S. Cl. ............... 330/290; 330/296
[58] Field of Search ............... 330/290, 296, 330/310, 311, 285

[56] References Cited

U.S. PATENT DOCUMENTS

| | | | |
|---|---|---|---|
| 4,237,414 | 12/1980 | Stein | 330/296 |
| 5,404,585 | 4/1995 | Vimpari et al. | 330/296 |

FOREIGN PATENT DOCUMENTS 0 544 387 A1  6/1993  European Pat. Off. .
2 406 849  10/1978  France .
4-369907  12/1992  Japan .

OTHER PUBLICATIONS

Patent Abstracts of Japan, Publication No. 520600476, Published May 18, 1977, Ito Mitsutoshi, "Bias Current Supply Circiut" .

"Investigation of the Temperature Stability of a Broadband Microwave Amplifier–Limiter", A.V. Baranov et al., Telecommunications and Radio Engineering, Jul. 1988, No. 7, New York, pp. 148–150.

Primary Examiner—Robert Pascal
Assistant Examiner—Patricia T. Nguyen
Attorney, Agent, or Firm—Hill & Simpson

[57] ABSTRACT

A transistor amplifier stage, in particular an RF amplifier stage with an npn amplifier transistor, which is coupled with its base to an alternating voltage input terminal, with its emitter to a fixed potential, and with its collector to an alternating voltage output terminal. An active operating point stabilization unit with a first and a second pnp transistor is provided between a direct voltage input terminal and the base of the npn amplifier transistor.

6 Claims, 3 Drawing Sheets

TRANSISTOR AMPLIFIER STAGE

BACKGROUND OF THE INVENTION

1. Field of the Invention

The present invention relates to a transistor amplifier stage with an npn amplifier transistor of which the base is coupled to an alternating voltage input terminal, the emitter is coupled to a fixed potential and the collector is coupled to an alternating voltage output terminal. In particular, it relates to a radio-frequency (RF) transistor amplifier stage.

2. Description of the Prior Art

Various transistor amplifier stages are known which, however, for the most part have the disadvantage that when designed for high RF amplification their direct current stabilization is decreased. The Darlington stage is cited here as an example, wherein the emitter of a first transistor is connected with the base of a second transistor, and the collector of the second transistor is connected with the collector of the first transistor. In addition, in this known circuit the base of the first transistor is connected with the collector thereof via a first electrical resistance and is connected with ground via a second electrical resistance. Both the emitter of the first transistor and the emitter of the second transistor are connected with ground via a third or, respectively, a fourth electrical resistance. The base of the first transistor is coupled to an alternating voltage input terminal, and the collector of the second transistor is coupled to an alternating voltage output terminal. In order to achieve a sufficient RF amplification of the second transistor, the fourth resistor must be designed with a low value. However, in doing so, the direct current stabilization of the second transistor is correspondingly reduced.

An RF amplifier stage which includes, generally, a transistor having its base coupled to an alternating voltage input terminal, having its emitter coupled to a fixed potential, and having its collector coupled to an alternating voltage output terminal is known from Patent Abstracts of Japan, E-1366, May 18, 1993, vol. 17/no. 249 (JP-A-4 369 907). An integrated circuit for RF amplification on an MMIC chip, including a Darlington transistor arrangement, is specified in EP-A-0 544 387.

SUMMARY OF THE INVENTION

An object of the present invention is to develop a transistor amplifier stage with an npn amplifier transistor, wherein the stage ensures an improved direct current stabilization of the npn amplifier transistor.

According to the teachings of the present invention, such object is achieved wherein it is provided in the transistor amplifier stage of the type described above that an active operating point stabilization unit with a first and second pnp transistor is arranged between a direct voltage input terminal and the base of the npn amplifier transistor. The collector of the first pnp transistor is coupled to the base of the second pnp transistor, the base of the first pnp transistor is coupled to the emitter of the second pnp transistor, and the collector of the second pnp transistor is coupled to the base of the npn amplifier transistor. In addition, a further connection terminal is coupled to the emitter of the second pnp transistor. The active operating point stabilization unit effects an improved direct current stabilization of the transistor amplifier stage.

In a preferred embodiment of the inventive transistor amplifier stage, an npn pre-stage transistor is provided that is coupled to the npn amplifier transistor in such a way that it forms a Darlington amplifier stage together therewith. The emitter of the npn pre-stage transistor is, for example, connected to the base of the npn amplifier transistor as well as to the fixed potential. The collector of the npn pre-stage transistor is connected to the collector of the npn amplifier transistor, and the base of the npn pre-stage transistor is connected to the alternating voltage input terminal. An electrical resistance is respectively arranged between the base and the collector of the npn pre-stage transistor, between the emitter of the npn pre-stage transistor and the fixed potential, and between the base of the npn pre-stage transistor and the fixed potential.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
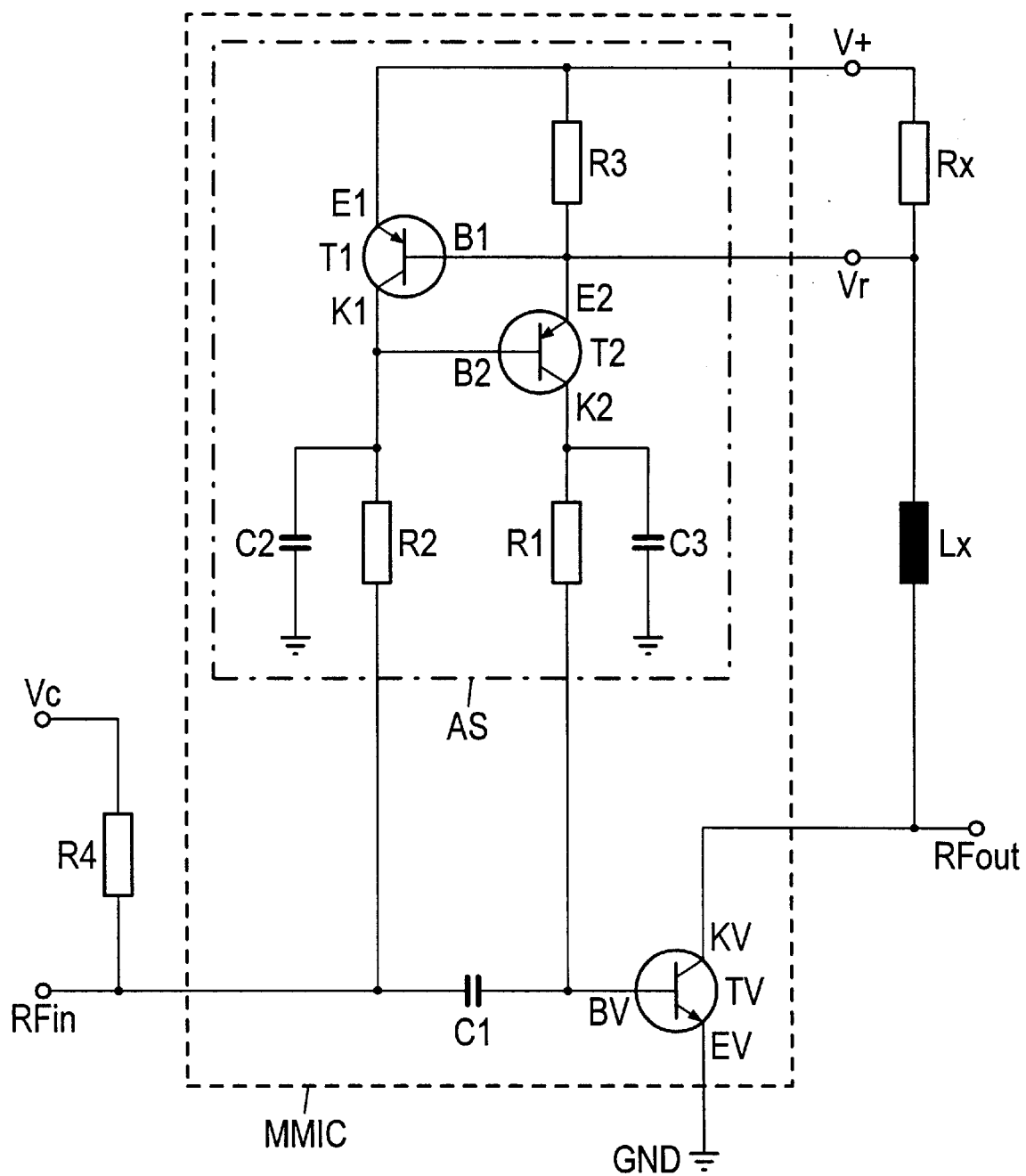
FIG. 1 shows a circuit plan of a first embodiment of the present invention.

In the circuit arrangement according to FIG. 1, an npn amplifier transistor TV is connected with its base BV to an alternating voltage input terminal RFin, with its emitter EV to a fixed potential GND and with its collector KV to an alternating current output terminal RFout. Between a direct voltage input terminal V+ and the base BV of the npn amplifier transistor TV, an active operating point stabilization unit AS is provided which includes a first pnp transistor T1 and a second pnp transistor T2. In this unit AS, the collector K1 of the first pnp transistor T1 is connected to the base B2 of the second pnp transistor T2, the base B1 of the first pnp transistor T1 is connected to the emitter E2 of the second pnp transistor T2, and the emitter E1 of the first pnp transistor T1 is connected to the direct voltage input terminal V+. Further, the collector K2 of the second pnp transistor T2 is connected to the base BV of the npn amplifier transistor TV via a first electrical resistor R1 and a circuit terminal Vr is connected to the emitter E2 of the second pnp transistor T2.

A first capacitor C1 is arranged between the alternating voltage input terminal RFin and the base of the npn amplifier transistor Tist. This serves for the direct current (DC) decoupling as well as for the RF matching of the npn amplifier transistor TV.

The collector K1 of the first pnp transistor T1 is also connected to the alternating voltage input terminal Rfin via a second electrical resistor R2. A second capacitor C2 and a third capacitor C3 are connected on the one hand to the collector K1 of the first pnp transistor T1 or, respectively, to the collector K2 of the second pnp transistor T2, and are applied on the other hand to a fixed potential GND, preferably to ground.

All the circuit elements described above are preferably integrated on a single MMIC chip. For the on-wafer measurement of the transistor amplifier stage, a third electrical resistor R3 can be connected between the direct voltage input terminal V+ and the emitter of the second pnp transistor T2.

In the operation of the transistor amplifier stage according to the embodiment of FIG. 1, an external electrical resistance Rx is connected between the direct voltage input terminal V+ and the further circuit terminal Vr, and a first inductance Lx is connected between the further circuit terminal Vr and the alternating voltage output terminal RFout. The precise operating current of the amplifier transistor TV can be set using the external electrical resistance Rx.

In addition, a control terminal Vc is connected to the alternating voltage input terminal RFin via a fourth electrical resistance R4. If the control terminal Vc is at fixed potential GND, a current through the active operating point stabilization unit AS can arise. If the control terminal Vc is at high, the second pnp transistor T2 blocks. In this way, the npn amplifier transistor TV can be switched on and off.

As described with reference to the embodiment of FIG. 2 below, the second electrical resistance R2 can be connected to the fixed potential GND instead of to the alternating voltage input terminal RFin. However, the on and off switching of the npn amplifier transistor TV is then not possible.

Figure 2:
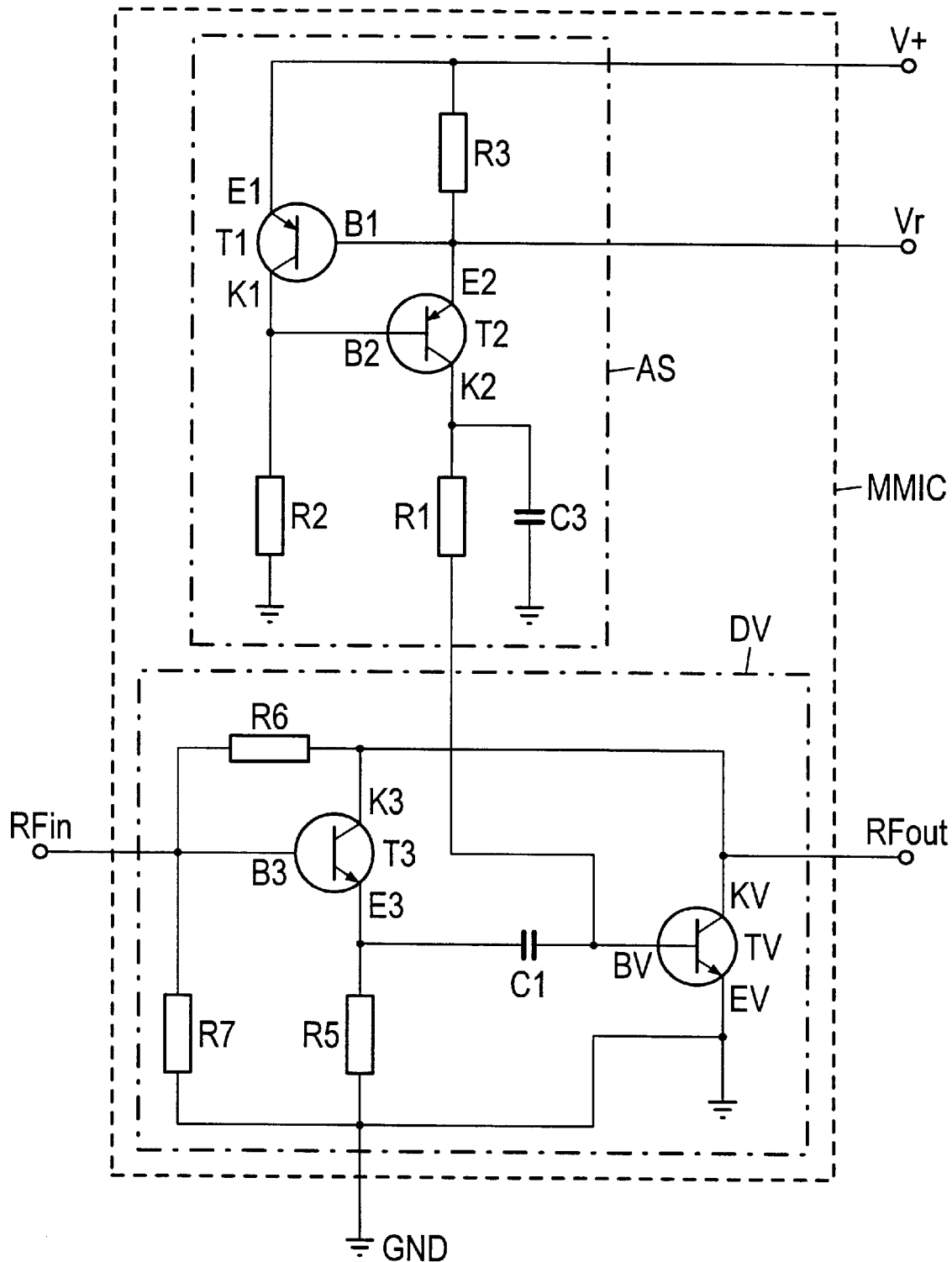
FIG. 2 shows a circuit plan of a second embodiment of the present invention.

In the embodiment of FIG. 2, an npn pre-stage transistor T3 is provided which is coupled to the npn amplifier transistor TV in such a way that together therewith it forms a Darlington amplifier stage DV. The emitter E3 of the npn pre-stage transistor T3 is connected to the base BV of the npn amplifier transistor TV via the first capacitor C1, and is connected to the fixed potential GND via a fifth electrical resistor R5. In addition, the collector K3 of the npn pre-stage transistor T3 is connected to the collector KV of the npn amplifier transistor TV and is further connected with its base B3 via a sixth electrical resistor R6. The base B3 of the npn pre-stage transistor T3 is connected to the alternating voltage input. terminal RFin and, via a seventh electrical resistor R7, is connected to the fixed potential GND.

Instead of being connected with the alternating voltage input terminal RFin, as in the embodiment of FIG. 1, the second electrical resistor R2 is connected with the fixed potential GND in Figure 2. In order to enable switching on and off of the npn amplifier transistor TV, the second electrical resistor R2 can be connected in a manner as in FIG. 1.

Figure 3:
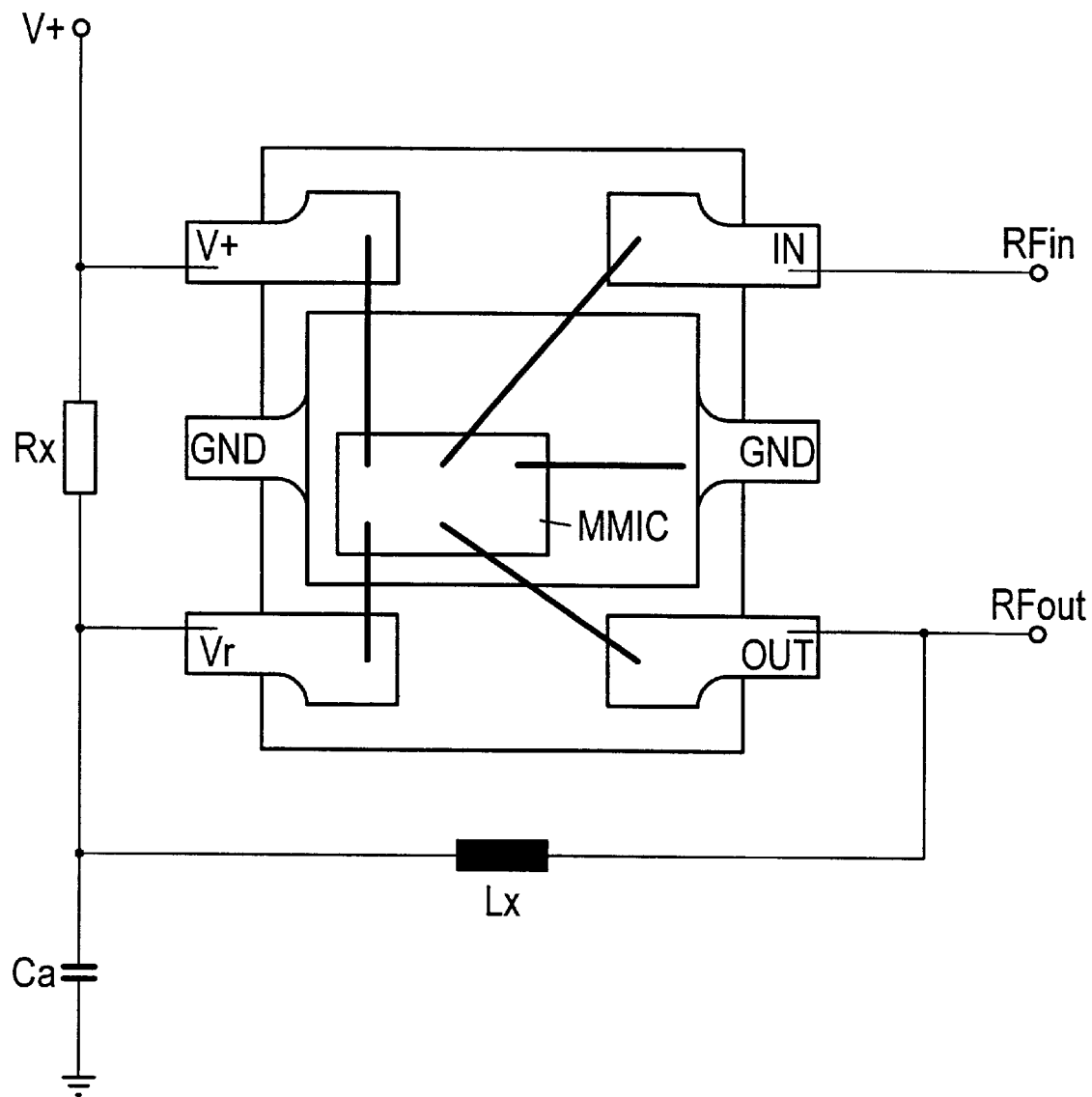
FIG. 3 shows a schematic view of an integrated module with an integrated amplifier stage according to the teachings of the present invention.

For the operation of the transistor amplifier stage, as shown in FIG. 3, a blocking capacitor CA is provided at the additional circuit terminal Vr in addition to the external resistor Rx. The external inductance Lx provides the module with the operating voltage and separates the alternating voltage output terminal RFout from the operating voltage in terms of alternating voltage.

In the module shown in FIG. 3, the MMIC chip is fastened to a chip mounting surface of a lead frame. This chip is connected with the additional terminal pins, arranged separate from the chip mounting surface, by means of bond wires. This is a known technique which will not be explained in further detail. In addition, FIG. 3 shows the external wiring of the module with the inductance Lx, with the external resistor Rx and with the blocking capacitor Ca.

Although the present invention has been described with reference to specific embodiments, those of skill in the art will recognize that changes may be made thereto without departing from the spirit and scope of the invention as set forth in the hereafter appended claims.

I claim as my invention:

1. A transistor amplifier stage, comprising:

an npn amplifier transistor having a base, an emitter and a collector;

an alternating voltage input terminal connected to the base of the npn amplifier transistor;

a fixed potential connected to the emitter of the npn amplifier transistor;

an alternating voltage output terminal connected to the collector of the npn amplifier transistor;

an active operating point stabilization unit having both first and second pnp transistors which, in turn, each have a base, an emitter and a collector, the stabilization unit positioned between a direct voltage input terminal and the base of the npn amplifier transistor, wherein the collector of the first pnp transistor is coupled to the base of the second pnp transistor, the base of the first pnp transistor is coupled to the emitter of the second pnp transistor, the emitter of the first pnp transistor is coupled to the direct voltage input terminal, and the collector of the second pnp transistor is coupled to the base of the npn amplifier transistor; and a further circuit terminal coupled to the emitter of the second pnp transistor.

2. A transistor amplifier stage as claimed in claim 1, further comprising:

a first resistor connected between the base of the npn amplifier transistor and the collector of the second pnp transistor.

3. A transistor amplifier stage as claimed in claim 1, wherein the collector of the first pnp transistor is coupled to the fixed potential.

4. A transistor amplifier stage as claimed in claim 1, wherein the collector of the first pnp transistor is coupled to a control terminal.

5. A transistor amplifier stage as claimed in claim 1, further comprising:

an npn pre-stage transistor coupled to the npn amplifier transistor wherein the combination forms a Darlington amplifier stage.

6. A transistor amplifier stage as claimed in claim 5, further comprising:

a second resistor connected between the base and the collector of the npn pre-stage transistor;

a third resistor connected between the emitter of the npn pre-stage transistor and the fixed potential;

a fourth resistor connected between the base of the npn pre-stage transistor and the fixed potential; and wherein the emitter of the npn pre-stage transistor is coupled to both the base of the npn amplifier transistor and the fixed potential, the collector of the npn pre-stage transistor is coupled to the collector of the npn amplifier transistor, and the base of the npn pre-stage transistor is coupled to the alternating voltage input terminal.

* * * * *